US007549139B1

(12) United States Patent
Tuan et al.

(10) Patent No.: US 7,549,139 B1
(45) Date of Patent: Jun. 16, 2009

(54) TUNING PROGRAMMABLE LOGIC DEVICES FOR LOW-POWER DESIGN IMPLEMENTATION

(75) Inventors: Tim Tuan, San Jose, CA (US); Jan L. deJong, Cupertino, CA (US); Kameswara K. Rao, San Jose, CA (US); Robert O. Conn, Los Gatos, CA (US)

(73) Assignee: XILINX, Inc., San Jose, CA (US)

(*) Notice: Subject to any disclaimer, the term of this patent is extended or adjusted under 35 U.S.C. 154(b) by 269 days.

(21) Appl. No.: 10/783,216

(22) Filed: Feb. 20, 2004

Related U.S. Application Data

(63) Continuation-in-part of application No. 10/666,669, filed on Sep. 19, 2003, now Pat. No. 7,098,689.

(51) Int. Cl.
*G06F 17/50* (2006.01)
*H03K 19/00* (2006.01)

(52) U.S. Cl. ............................................ 716/17; 716/6

(58) Field of Classification Search ..................... 716/4, 716/2, 3, 6, 16; 365/200
See application file for complete search history.

(56) References Cited

U.S. PATENT DOCUMENTS

| | | | | |
|---|---|---|---|---|
| 4,962,341 A | | 10/1990 | Schoeff | |
| 5,303,390 A | | 4/1994 | Little | |
| 5,362,989 A | | 11/1994 | Hennedy | |
| 5,519,663 A | | 5/1996 | Harper et al. | |
| 5,568,062 A | | 10/1996 | Kaplinsky | |
| 5,583,457 A | | 12/1996 | Horiguchi et al. | |
| 5,612,892 A | * | 3/1997 | Almulla | 716/6 |
| 5,615,162 A | | 3/1997 | Houston | |
| 5,671,149 A | | 9/1997 | Brown | |
| 5,682,107 A | | 10/1997 | Tavana et al. | |
| 5,712,790 A | * | 1/1998 | Ditlow et al. | 716/2 |
| 5,801,548 A | | 9/1998 | Lee et al. | |
| 5,811,962 A | | 9/1998 | Ceccherelli et al. | |
| 5,825,662 A | * | 10/1998 | Trimberger | 716/3 |
| 5,832,286 A | | 11/1998 | Yoshida | |
| 5,914,873 A | | 6/1999 | Blish, II | |

(Continued)

OTHER PUBLICATIONS

U.S. Appl. No. 10/606,619, filed Jun. 26, 2003, New et al.

(Continued)

*Primary Examiner*—Leigh Marie Garbowski
(74) *Attorney, Agent, or Firm*—E. Eric Hoffman; John J. King

(57) ABSTRACT

A method of operating a programmable logic device includes the steps of using a full $V_{DD}$ supply voltage to operate a first set of active blocks of the programmable logic device, and using a reduced supply voltage (e.g., 0.9 $V_{DD}$) to operate a second set of active blocks of the programmable logic device. A timing analysis is performed to determine the maximum available timing slack in each active block. Active blocks having a smaller timing slack are grouped in the first set, and are coupled to receive the full $V_{DD}$ supply voltage. Active blocks having a larger timing slack are grouped in the second set, and are coupled to receive the reduced $V_{DD}$ supply voltage. As a result, the active blocks in the second set exhibit reduced power consumption, without adversely affecting the overall speed of the programmable logic device.

19 Claims, 9 Drawing Sheets

700

101 USER DESIGN
102 DESIGN SYNTHESIS
103 PLACE AND ROUTE
701 PERFORM TIMING ANALYSIS
702 IDENTIFY PATHS WITH N% TIMING SLACK
703 DETERMINE MINIMUM TIMING SLACK FOR EACH BLOCK
704 DETERMINE MINIMUM OPERATING VOLTAGE FOR EACH BLOCK IN RESPONSE TO THE MINIMUM TIMING SLACK
104 GENERATE BIT STREAM
105 CONFIGURE THE PLD

U.S. PATENT DOCUMENTS

| | | | | |
|---|---|---|---|---|
| 5,946,257 | A | 8/1999 | Keeth | |
| 5,958,026 | A | 9/1999 | Goetting et al. | |
| 6,038,386 | A * | 3/2000 | Jain | 716/16 |
| 6,114,843 | A | 9/2000 | Olah | |
| 6,148,390 | A | 11/2000 | MacArthur | |
| 6,160,418 | A | 12/2000 | Burnham | |
| 6,169,419 | B1 | 1/2001 | De et al. | |
| 6,172,518 | B1 | 1/2001 | Jenkins, IV et al. | |
| 6,208,171 | B1 | 3/2001 | Kumagai et al. | |
| 6,384,626 | B2 | 5/2002 | Tsai et al. | |
| 6,466,049 | B1 | 10/2002 | Diba et al. | |
| 6,489,804 | B1 | 12/2002 | Burr | |
| 6,583,645 | B1 | 6/2003 | Bennett et al. | |
| 6,631,502 | B2 | 10/2003 | Buffet et al. | |
| 6,710,621 | B2 | 3/2004 | Devlin et al. | |
| 6,711,719 | B2 | 3/2004 | Cohn et al. | |
| 6,747,478 | B2 | 6/2004 | Madurawe | |
| 6,839,888 | B2 | 1/2005 | Gupta | |
| 6,885,563 | B2 | 4/2005 | Panella et al. | |
| 6,936,917 | B2 | 8/2005 | Lopata et al. | |
| 6,950,998 | B1 | 9/2005 | Tuan | |
| 6,960,934 | B2 | 11/2005 | New | |
| 6,968,467 | B2 | 11/2005 | Inoue et al. | |
| 7,003,620 | B2 | 2/2006 | Avraham et al. | |
| 7,078,932 | B2 | 7/2006 | Swami | |
| 7,080,341 | B2 | 7/2006 | Eisenstadt et al. | |
| 7,098,689 | B1 | 8/2006 | Tuan et al. | |
| 7,109,748 | B1 | 9/2006 | Liu et al. | |
| 7,112,997 | B1 | 9/2006 | Liang et al. | |
| 7,135,886 | B2 | 11/2006 | Schlacter | |
| 7,170,315 | B2 | 1/2007 | Bakker et al. | |
| 7,313,708 | B2 | 12/2007 | Oshins | |
| 2003/0030326 | A1 | 2/2003 | Shenai et al. | |
| 2003/0218478 | A1 | 11/2003 | Sani et al. | |
| 2004/0145955 | A1 * | 7/2004 | Mizuno et al. | 365/200 |
| 2005/0091547 | A1 | 4/2005 | Hanrieder et al. | |
| 2005/0201174 | A1 | 9/2005 | Klein | |
| 2006/0053246 | A1 | 3/2006 | Lee | |
| 2006/0069851 | A1 | 3/2006 | Chung et al. | |
| 2006/0202713 | A1 | 9/2006 | Sergey Shumarayev | |
| 2007/0001720 | A1 | 1/2007 | Li et al. | |
| 2007/0164785 | A1 | 7/2007 | He | |

OTHER PUBLICATIONS

U.S. Appl. No. 10/377,857, filed Feb. 28, 2003, Blodget et al.

He, Lei; "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http://eda.ee.ucla.edu/.

FPGA 2004 Advance Program; ACM/SIGDA Eleventh international Symposium of Field Programmable Gate Arrays, Feb. 22-24, 2004, 6 pages, at Monterey Beach Hotel, Monterey, California, available at http://fpga20044.ece.ubc.ca/.

Takahashi, M. et al.; "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.

U.S. Appl. No. 10/783,589, filed Feb. 20, 2004, Look et al.

Mutoh, S. et al., "1-V Power Supply High-Speed Digital Circuit Technology with Multithreshold-Voltage CMOS," Aug. 1995, pp. 847-854, vol. 30, No. 8, available from IEEE Journal of Solid-State Circuits, 3, Park Avenue, 17th Floor, New York, NY 10016-5997.

Kuroda, T., et al., A 0.9V, 150-MHz, 1-mW, 4 $mm^2$2-D Discrete Cosine Transform Core Processor with Variable Threshold-Voltage (VT) Scheme, 1996, pp. 1770-1779, vol. 31, No. 11, available from IEEE Journal of Solid-State Circuits, IEEE, 3 Park Avenue, 17th Floor, New York, NY 10016-5997.

Inukai, T. et al., "Boosted Gate MOS (BGMOS): Device/Circuit Cooperation Scheme to Achieve Leakage-Free Giga-Scale Integration," 2000, pp. 409-412, available from IEEE Journal of Solid-State Circuits, IEEE, 3 Park Avenue, 17th Floor, New York, NY 10016-5997.

Hamzaoglu, F. et al., "Circuit-Level Techniques to Control Gate Leakage for sub-100nm CMOS," ISLPED, Aug. 12-14, 2002, pp. 60-63, available from IEEE Journal of Solid-State Circuits, IEEE, 3 Park Avenue, 17th Floor, New York, NY 10016-5997.

Jae Y. Park, Mark G. Allen; "A Comparison of Micromachined Inductors with Different Magnetic Core Materials"; 1996 Electronic Components and Technology Conference; 1996 IEEE; pp. 375-381.

Thomas D. Burd et al.; "A Dynamic Voltage Scaled Microprocessor System"; 2000 IEEE; IEEE Journal of Solid-State Circuits, vol. 35, No. 11, Nov. 2000; pp. 1571-1580.

Anthony J. Stratakos et al.; "A Low-Voltage CMOS DC-DC Converter for a Portable Battery-Operated System"; 1994 IEEE; pp. 619-626.

Anthony John Stratakos; "High-Efficiency Low-Voltage DC-DC Conversion for Portable Applications," Chapter 3; "DC-DC Converter Fundamentals"; pp. 42-78.

Allen/Holberg; Chapter 10; "Bandgap Voltage Reference"; Apr. 12, 2000; downloaded on Jan. 3, 2006 from www.ece.utexas.edu/~holberg/lecture_notes/bandgap.pdf; pp.1-5.

Microchip Technology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28.

Xilinx, Inc.; "Virtex-II Pro Platform FPGA Handbook"; published Oct. 14, 2002; available from Xilinx, Inc., 2100 Logic Drive, San Jose, California 95124; pp. 19-71.

Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.-3L.

Intel Corporation, "Intel PXA27 Processor Family Power Requirements", Application Note, 2004, pp. 1-36, available from Intel Corporation (Santa Clara) Corporate Office, 2200 Mission College Blvd., Santa Clara, California 95052-8119.

Nowka, Kevin J., A32-bit PowerPC System-on-a-Chip With Support For Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.

Texas Instruments (Benchmarq) - Datasheet BQ4011 (32x8 nonvolatile SRAM) Aug. 1993 pp. 1-11.

Texas Instruments - Datasheet BQ4011 (32x8 nonvolatile SRAM) May 1999 pp. 1-15.

U.S. Appl. No. 10/971,934 filed Oct. 22, 2004, Jenkins, Jesse H. IV, entitled " Low Power Zones For Programmable Logic Devices", Xilinx, Inc., San Jose, CA.

U.S. Appl. No. 11/268,265 filed Nov. 4, 2005, Rahman, Arifur, et al. entitled " Implementation of Low Power Standby Modes For Intergrated Circuits", Xilinx, Inc., San Jose, CA.

U.S. Appl. No. 11/325,888 filed Jan. 4, 2006, Tuan, Tim, entitled "Programmable Low Power Modes For Embedded Memory Blocks", Xilinx Inc., San Jose, CA.

U.S. Appl. No. 11/326,542 filed Jan. 4, 2006, Jacobson, Neil G.. et al., entitled "M ethod and Mechanism for Controlling Power Consumption of an Integrated Circuit", Xilinx, Inc., San Jose, CA.

U.S. Appl. No. 11/329,646 filed Jan. 11, 2006, Jenkins, Jesse H. IV, entitled "Programmable Detection of Power Failure in an Integrated Circuit", Xilinx, Inc., San Jose, CA.

U.S. Appl. No. 11/502,939 filed Aug. 11, 2006, Tuan, Tim, et al., entitled "Disabled Unused/Inactive Resources in Programmable Logic Devices for Static Power Reduction", Xilinx, Inc., San Jose, CA.

US 6,981,160, 12/2005, Thaker et al. (withdrawn)

* cited by examiner

TUNING PROGRAMMABLE LOGIC DEVICES FOR LOW-POWER DESIGN IMPLEMENTATION

RELATED APPLICATION

The present application is a continuation-in-part of U.S. patent application Ser. No. 10/666,669 filed by Tim Tuan, Kameswara K. Rao and Robert O. Conn on Sep. 19, 2003 now U.S. Pat. No. 7,098,689, which is incorporated herein in its entirety.

FIELD OF THE INVENTION

The present invention relates to the regulation of the supply voltage provided to unused and/or inactive blocks in a programmable logic device to achieve lower power consumption. More specifically, the present invention relates to selectively reducing the operating voltage of various sections of an integrated circuit device in order to reduce the leakage current and/or increase the performance of the device.

RELATED ART

Programmable logic devices (PLDs), such as field programmable gate arrays (FPGAs), have a significantly higher static power consumption than dedicated logic devices, such as standard-cell application specific integrated circuits (ASICs). A reason for this high static power consumption is that for any given design, a PLD only uses a subset of the available resources. The unused resources are necessary for providing greater mapping flexibility to the PLD. However, these unused resources still consume static power in the form of leakage current. Consequently, PLDs are generally less likely to be used in applications where low static power is required.

It would therefore be desirable to have a PLD having a reduced static power consumption.

Programmable logic devices (PLDs) also have a significantly higher dynamic power consumption than dedicated logic devices because the PLD resources (logic and routing) are designed with a fixed level of performance, regardless of the requirements of the specific application being implemented by the PLD. Most PLD applications do not require the maximum hardware speed for some (or even all) parts of the PLD. As a result, "timing slack" exists in different parts of the PLD. In fact, the timing critical part of a PLD design typically represents a very small portion of the whole design. In circuit design, higher speed circuits generally consume more power, both dynamic and static. Consequently, the parts of the PLD that are not operated at the maximum hardware speed represent an inefficient use of power.

It would therefore be desirable to improve the power efficiency of a programmable logic device by taking advantage of the timing slack present in different parts of a PLD design.

SUMMARY

In accordance with one embodiment of the present invention, unused and/or inactive resources in a PLD are disabled to achieve lower power consumption.

One embodiment of the present invention provides a method of operating a PLD, which includes the steps of enabling the resources of the PLD that are used in a particular circuit design, and disabling the resources of the PLD that are unused or inactive. The step of disabling can include decoupling the unused or inactive resources from one or more power supply terminals. Alternately, the step of disabling can include regulating (e.g., reducing) a supply voltage applied to the unused or inactive resources.

In accordance with one embodiment, the step of disabling can be performed in response to configuration data bits stored by the PLD. These configuration data bits can be determined during the design of the circuit to be implemented by the PLD. That is, during the design, the design software is able to identify unused resources of the PLD, and select the configuration data bits to disable these unused resources.

The step of disabling can also be performed in response to user-controlled signals. These user-controlled signals can be generated in response to observable operating conditions of the PLD. For example, if certain resources of the operating PLD are inactive for a predetermined time period, then the user-controlled signals may be activated, thereby causing the inactive resources to be disabled.

In accordance with another embodiment, a PLD includes a first voltage supply terminal that receives a first supply voltage, a plurality of programmable logic blocks, and a plurality of switch elements, wherein each switch element is coupled between one of the programmable logic blocks and the first voltage supply terminal. A control circuit coupled to the switch elements provides a plurality of control signals that selectively enable or disable the switch elements. The control circuit can be controlled by a plurality of configuration data values stored by the PLD and/or a plurality of user-controlled signals.

In an alternate embodiment, each of the switch elements can be replaced by a switching regulator. In this embodiment, the operating voltage applied to different blocks of the PLD may be adjusted in view of the timing slack available in these blocks. That is, a block with a large amount of timing slack can be operated at a lower voltage, thereby causing the block to operate at a slower speed, which is acceptable within the parameters of the PLD design. The lower operating voltage advantageously reduces the leakage current in the block. Blocks with a small amount of timing slack are operated at a higher voltage, thereby enabling these blocks to operate at the required high speed.

In accordance with one embodiment, the switching regulator can be a high-voltage n-channel transistor having a drain coupled to the $V_{DD}$ voltage supply and a source coupled to the programmable logic block. The gate of the high voltage transistor is coupled to receive a control voltage from a corresponding control circuit. The control circuit determines whether the corresponding programmable logic block is in an active or inactive state in response to user controlled signals and/or configuration data bits. When the programmable logic block is active, the control circuit applies a high control voltage $V_{BOOST}$, which is greater than the $V_{DD}$ supply voltage, to the gate of the high voltage transistor, such that the full $V_{DD}$ supply voltage is applied to the programmable logic block. When the programmable logic block is inactive, the control circuit applies a low control voltage $V_{STANDBY}$, which is less than the $V_{DD}$ supply voltage, to the gate of the high voltage transistor, such that a voltage of about one half the $V_{DD}$ supply voltage is applied to the programmable logic block. A feedback mechanism can be employed to ensure that the voltage applied to the programmable logic block is precisely equal to one half the $V_{DD}$ supply voltage.

In accordance with another embodiment, a method of operating a programmable logic device includes the steps of using a full $V_{DD}$ supply voltage to operate a first set of active blocks of the programmable logic device, and using a reduced supply voltage (e.g., 0.9 $V_{DD}$) to operate a second set of active blocks of the programmable logic device. A timing analysis is performed during design time and/or run time, in order to determine the maximum available timing slack in each active block. Active blocks having a relatively small timing slack are grouped in the first set, and are coupled to receive the full $V_{DD}$ supply voltage. As a result, the active blocks in the first set receive a voltage high enough to enable these blocks to meet the timing requirements of the PLD design.

Active blocks having a relatively large timing slack are grouped in the second set, and are coupled to receive the reduced $V_{DD}$ supply voltage. As a result, the active blocks in the second set exhibit reduced power consumption (as a result of operating in response to the reduced $V_{DD}$ supply voltage). In addition, the active blocks in the second set meet the timing requirements of the PLD design, in spite of operating in response to the reduced $V_{DD}$ supply voltage, because of the large timing slack initially present in these blocks. As a result, operating the active blocks in the second set at the reduced $V_{DD}$ supply voltage does not adversely affect the overall speed of the programmable logic device.

The reduced $V_{DD}$ supply voltage can be supplied in various manners, including, but not limited to, variable voltage switching regulators, or a separate voltage supply. The application of the full $V_{DD}$ voltage supply or the reduced $V_{DD}$ voltage supply can be controlled by configuration data bits and/or user control signals.

The present invention will be more fully understood in view of the following description and drawings.

DETAILED DESCRIPTION

In accordance with one embodiment of the present invention, unused and inactive resources in a programmable logic device (PLD), such as a field programmable gate array (FPGA), are disabled to achieve lower static power consumption. The present invention includes both an enabling software flow and an enabling hardware architecture, which are described in more detail below. Unused resources of the PLD can be disabled when designing a particular circuit to be implemented by the PLD (hereinafter referred to as "design time"). In addition, resources of the PLD that are temporarily inactive can be disabled during operation of the PLD (hereinafter referred to as "run time").

Figure 1:
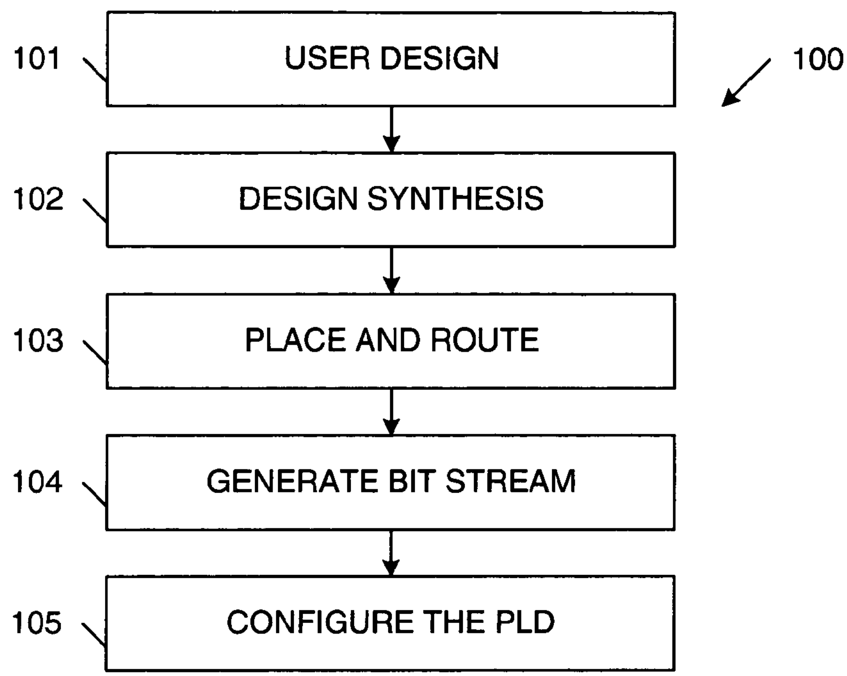
FIG. 1 is a flow diagram illustrating a conventional design flow used for PLDs.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bit stream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

In accordance with the present invention, unused resources of the PLD are identified during the design time, following the place and route process (Step 103). These unused resources are then selectively disabled during the design time. As described below, there are several ways to disable the unused resources. By selectively disabling the unused resources at design time, significant static power reduction may be achieved with no performance penalty.

Figure 2:
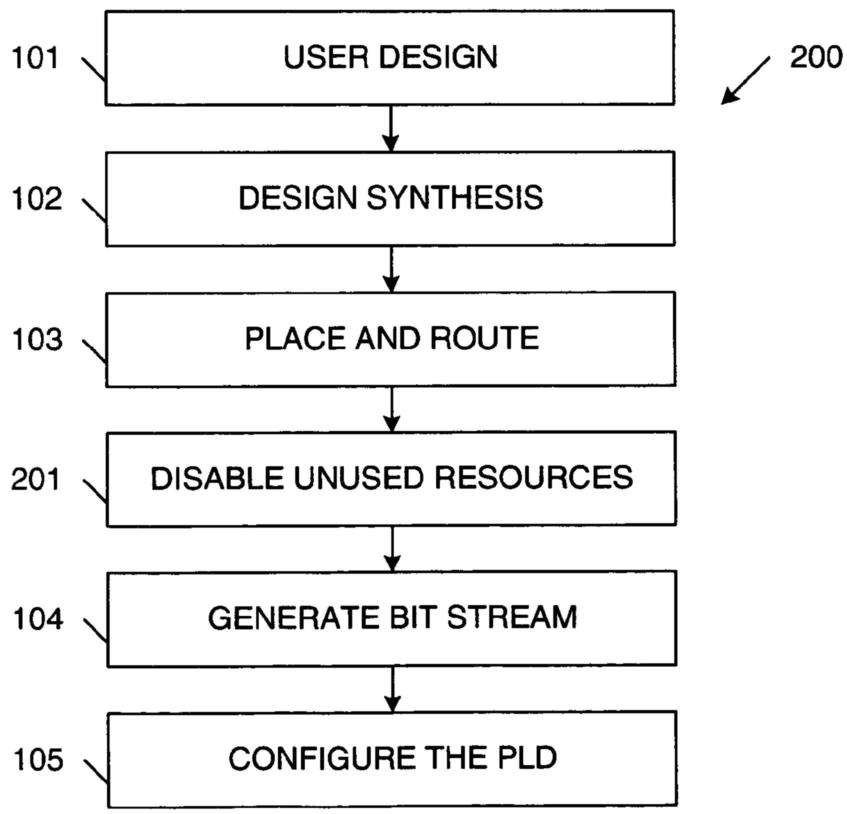
FIG. 2 is a flow diagram illustrating a design flow for a PLD in accordance with one embodiment of the present invention.

FIG. 2 is a flow diagram 200 illustrating a design flow in accordance with one embodiment of the present invention. Similar steps in flow diagrams 100 and 200 are labeled with similar reference numbers. Thus, flow diagram 200 includes Steps 101–105 of flow diagram 100, which are described above. In addition, flow diagram 200 includes the step of disabling unused resources in the PLD (Step 201). This step of disabling unused resources is performed after the place and route process has been completed in Step 103, and before the configuration bit stream is generated in Step 104. As described in more detail below, the unused resources are disabled by disabling predetermined programmable logic blocks of the PLD.

In another embodiment, further power savings are obtained by disabling temporarily inactive resources of the configured PLD during run time. Often, the entire design or parts of the design are temporarily inactive for some period of time. If the inactive period is sufficiently long, it is worthwhile to disable the inactive resources to reduce static power consumption. In a preferred embodiment, the decision of when to disable a temporarily inactive resource is made by the designer. In this embodiment, the user logic is provided access to a disabling mechanism, which enables the inactive resources to be disabled dynamically.

There are a number of techniques to disable resources in a PLD. In accordance with one embodiment, the PLD is logically subdivided into a plurality of separate programmable logic blocks. As described below, each programmable logic block may comprise one or more of the resources available on the programmable logic device. Switch elements are used to couple each of the programmable logic blocks to one or more associated voltage supply terminals (e.g., $V_{DD}$ or ground). The switch elements are controlled to perform a power-gating function, wherein unused and/or inactive programmable logic blocks are disabled (e.g., prevented from receiving power or receiving a reduced power). Preferably, only one of the voltage supply terminals ($V_{DD}$ or ground) is power-gated, thereby reducing the speed and area penalties associated with the switch elements. When the switch elements are controlled to de-couple the associated programmable logic blocks from the associated supply voltage, these programmable logic blocks are effectively disabled, thereby dramatically reducing the static power consumption of these blocks.

Figure 3:
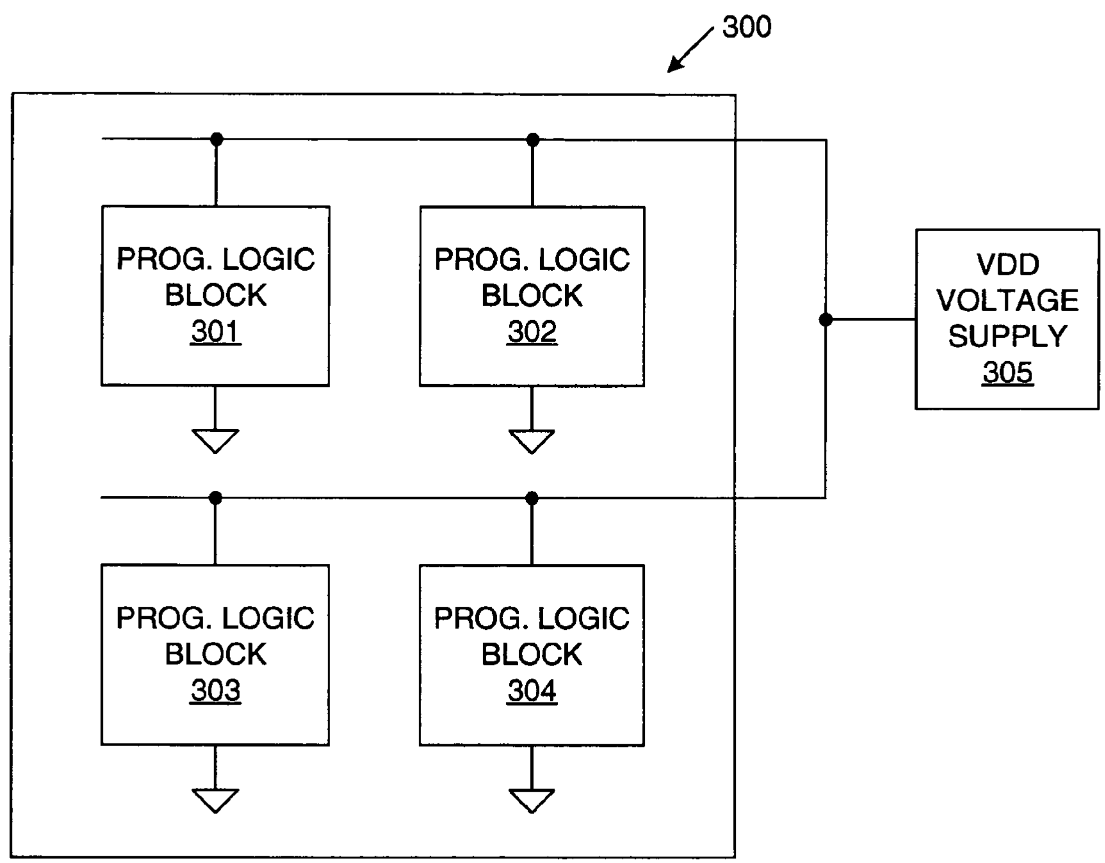
FIG. 3 is a block diagram of a conventional PLD having four blocks, which are all powered by the same off-chip $V_{DD}$ voltage supply.

FIG. 3 is a block diagram of a conventional PLD 300 having four programmable logic blocks 301–304, which are all powered by the same off-chip $V_{DD}$ voltage supply 305. Note that all four programmable logic blocks 301–304 are coupled to receive the $V_{DD}$ supply voltage during normal operating conditions, even if some of these blocks are not used in the circuit design.

Figure 4:
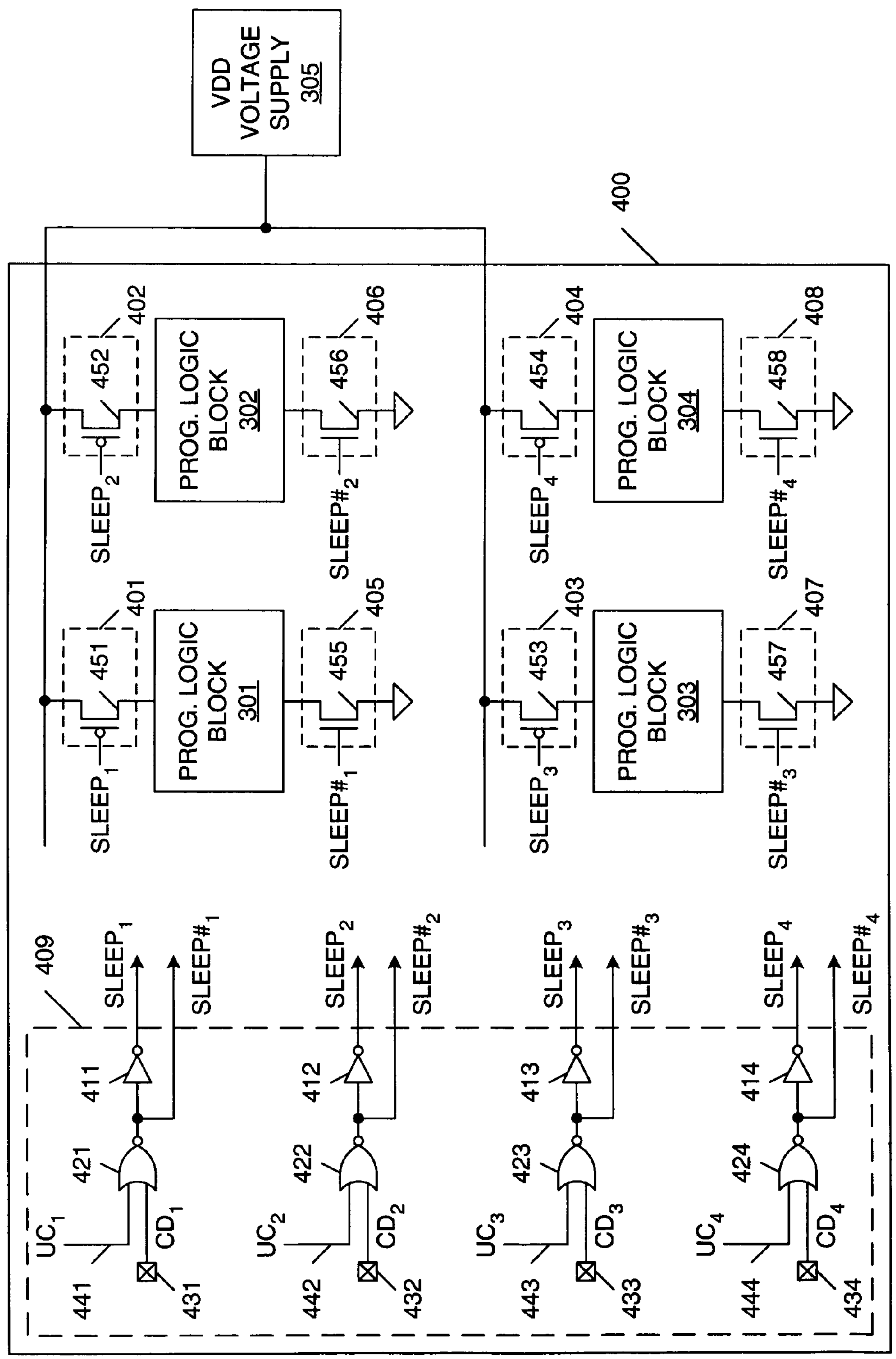
FIG. 4 is a block diagram of a PLD that implements power-gating switch elements in accordance with one embodiment of the present invention.

FIG. 4 is a block diagram of a PLD 400 in accordance with one embodiment of the present invention. Similar elements in FIGS. 3 and 4 are labeled with similar reference numbers. Thus, PLD 400 includes programmable logic blocks 301–304 and $V_{DD}$ voltage supply 305. In addition, PLD 400 includes switch elements 401–408, and control circuit 409. In the described embodiment, switch elements 401–404 are implemented by PMOS power-gating transistors 451–454, respectively, and switch elements 405–408 are implemented by NMOS power-gating transistors 455–458, respectively. In other embodiments, switch elements 401–408 may be any switch known to those ordinarily skilled in the art. Control circuit 409 is implemented by inverters 411–414, NOR gates 421–424, configuration memory cells 431–434, and user logic input terminals 441–444.

NOR gates 421–424 and inverters 411–414 are configured to generate power-gating control signals $SLEEP_1$–$SLEEP_4$ and $SLEEP\#_1$–$SLEEP\#_4$ in response to the configuration data values $CD_1$–$CD_4$ stored in configuration memory cells 431–434, respectively, and the user control signals $UC_1$–$UC_4$ provided on user logic input terminals 441–444, respectively.

For example, NOR gate 421 is coupled to receive configuration data value $CD_1$ from configuration memory cell 431 and user control signal $UC_1$ from user logic input terminal 441. If either the configuration data value $CD_1$ or the user control signal $UC_1$ is activated to a logic high state, then NOR gate 421 provides an output signal ($SLEEP\#_1$) having a logic "0" state. In response, inverter 411, which is coupled to the output terminal of NOR gate 421, provides an output signal ($SLEEP_1$) having a logic "1" state.

The $SLEEP_1$ signal is applied to the gate of PMOS power-gating transistor 451, which is coupled between block 301 and the $V_{DD}$ voltage supply terminal. The $SLEEP\#_1$ signal is applied to the gate of NMOS power-gating transistor 455, which is coupled between block 301 and the ground voltage supply terminal. The logic "0" state of the $SLEEP\#_1$ signal causes NMOS power-gating transistor 455 to turn off, thereby de-coupling block 301 from the ground supply voltage terminal. Similarly, the logic "1" state of the $SLEEP_1$ signal causes PMOS power-gating transistor 451 to turn off, thereby de-coupling block 301 from the $V_{DD}$ supply voltage terminal. De-coupling block 301 from the $V_{DD}$ and ground supply voltage terminals effectively disables block 301, thereby minimizing the static leakage current in this block.

If both the configuration data value $CD_1$ and the user control signal $UC_1$ are de-activated to a logic low state, then NOR gate 421 provides a $SLEEP\#_1$ signal having a logic "1" state, and inverter 411 provides a $SLEEP_1$ signal having a logic "0" state. The logic "1" state of the $SLEEP\#_1$ signal causes NMOS power-gating transistor 455 to turn on, thereby coupling block 301 to the ground supply voltage terminal. Similarly, the logic "0" state of the $SLEEP_1$ signal causes PMOS power-gating transistor 451 to turn on, thereby coupling block 301 to the $V_{DD}$ supply voltage terminal. Coupling block 301 to the $V_{DD}$ and ground supply voltage terminals effectively enables block 301.

Programmable logic block 302 may be enabled and disabled in response to configuration data value $CD_2$ and user control signal $UC_2$, in the same manner as block 301. Similarly, programmable logic block 303 may be enabled and disabled in response to configuration data value $CD_3$ and user control signal $UC_3$, in the same manner as block 301. Programmable logic block 304 may be enabled and disabled in response to configuration data value $CD_4$ and user control signal $UC_4$, in the same manner as block 301.

As described above, when a programmable logic block is used and active, the associated power-gating transistors are turned on. Conversely, when a programmable logic block is unused or inactive, the associated power gating transistors are turned off. The $SLEEP_1$—$SLEEP_4$ and $SLEEP\#_1$—$SLEEP\#_4$ signals can be controlled by the configuration data values $CD_1$–$CD_4$ stored by configuration memory cells 431–434, which are best suited for disabling the associated blocks at design time. If a block is not disabled at design time, this block can be disabled at run time by the user control signals $UC_1$–$UC_4$, which may be generated by the user logic, or by other means.

In accordance with another embodiment of the present invention, some blocks have multiple supply voltages. In this case all of the supply rails should be power-gated to achieve maximum power reduction. In accordance with another embodiment, only one switch element may be associated with each block. That is, the blocks are power-gated by decoupling the block from only one power supply terminal, and not both the $V_{DD}$ and ground supply voltage terminals, thereby conserving layout area.

The granularity of the power-gated programmable logic blocks can range from arbitrarily small circuits to significant portions of the PLD. The decision concerning the size of each programmable logic block is made by determining the desired trade-off between power savings, layout area overhead of the switch elements and the control circuit, and speed penalty. In a FPGA, each programmable logic block may be selected to include one or more configuration logic blocks (CLBs), input/output blocks (IOBs), and/or other resources of the FPGA (such as block RAM, processors, multipliers, adders, transceivers).

Another way to disable a programmable logic block is by scaling down the local supply voltage to the block as low as possible, which dramatically reduces the power consumption of the block. To scale down the local supply voltage in this manner, each independently controlled programmable logic block is powered by a separate switching regulator.

Figure 5:
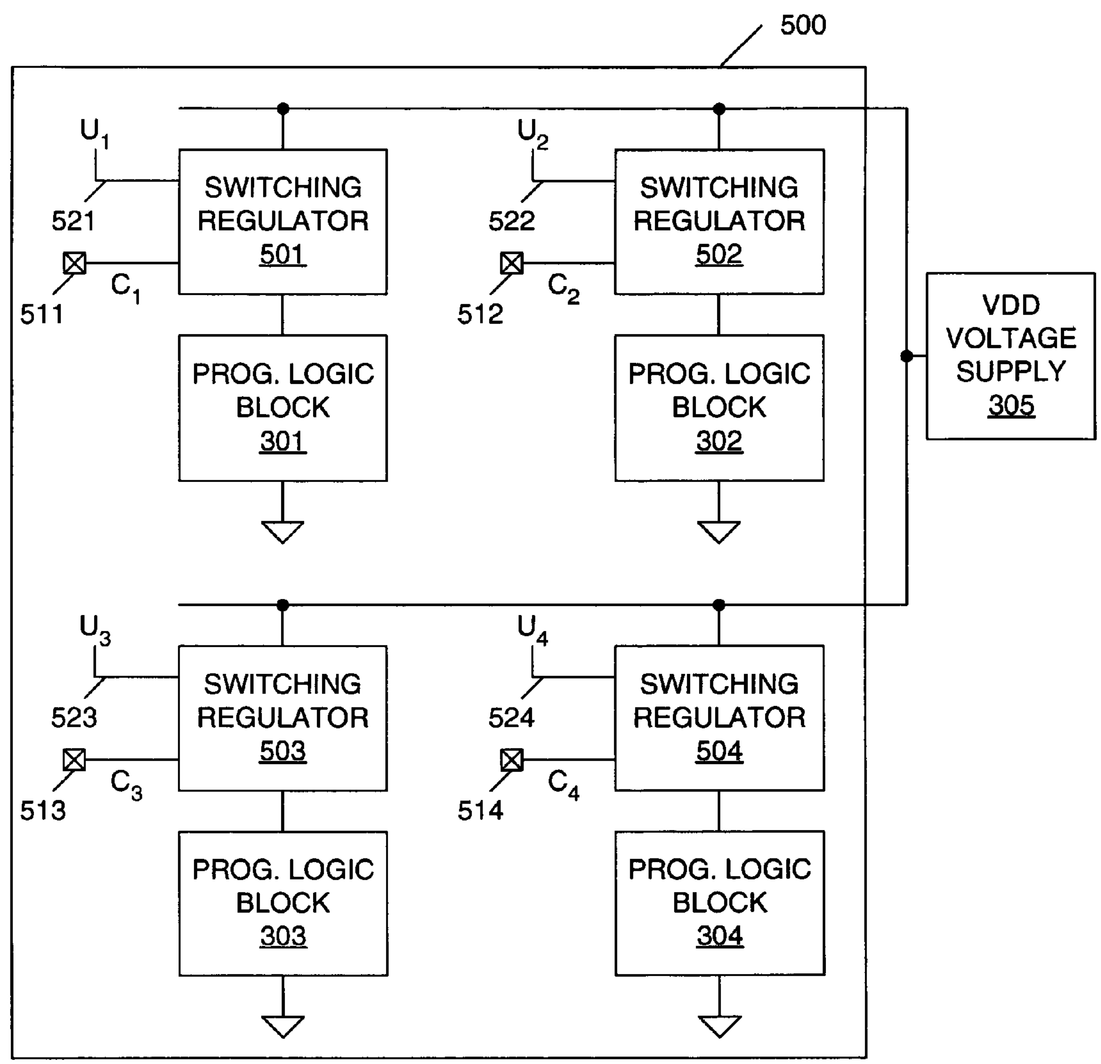
FIG. 5 is a block diagram of a PLD that implements switching regulators in accordance with one embodiment of the present invention.

FIG. 5 is a block diagram of a PLD 500 that implements switching regulators in accordance with one embodiment of the present invention. Similar elements in FIGS. 3 and 5 are labeled with similar reference numbers. Thus, PLD 500 includes programmable logic blocks 301–304 and $V_{DD}$ voltage supply 305. In addition, PLD 500 includes switching regulators 501–504, which are coupled between blocks 301–304, respectively, and $V_{DD}$ voltage supply 305. Switching regulators 501–504 are controlled by control circuits 511–514, respectively. In the described embodiment, switching regulators 501–504 reside on the same chip as blocks 301–304. However, in other embodiments, these switching regulators can be located external to the chip containing blocks 301–304. Switching regulators 501–504 can be programmably tuned to provide the desired supply voltages to the associated programmable logic blocks 301–304. For example, switching regulator 501 can provide a full $V_{DD}$ supply voltage to programmable logic block 301 when this block is used and active. However, switching regulator 501 can further be controlled to provide a reduced voltage (e.g., some percentage of the $V_{DD}$ supply voltage) to programmable logic block 301 when this block is unused or inactive. This reduced voltage may be predetermined (by design or via testing) depending on the desired circuit behavior. For example, this reduced voltage may be the minimum voltage required to maintain the state of the associated blocks. The power consumption of block 301 is significantly reduced when the supplied voltage is reduced in this manner.

Switching regulators 501–504 are controlled in response to the configuration data values $C_1$–$C_4$ stored in configuration memory cells 511–514, respectively, and the user control signals $U_1$–$U_4$ provided on user control terminals 521–524, respectively. A configuration data value (e.g., $C_1$) having an activated state will cause the associated switching regulator (e.g., switching regulator 501) to provide a reduced voltage to the associated programmable logic block (e.g., block 301). Similarly, a user control signal (e.g., $U_2$) having an activated state will cause the associated switching regulator (e.g., switching regulator 502) to provide a reduced voltage to the associated programmable logic block (e.g., block 502). A configuration data value (e.g., $C_3$) and an associated user control signal (e.g., $U_3$) both having have deactivated states will cause the associated switching regulator (e.g., switching regulator 503) to provide the full $V_{DD}$ supply voltage to the associated programmable logic block (e.g., block 503).

In accordance with one embodiment, configuration data values $C_1$–$C_4$ may be selected at design time, such that reduced voltages are subsequently applied to unused blocks during run time. User control signals $U_1$–$U_4$ may be selected during run time, such that reduced voltages are dynamically applied to inactive blocks at run time. Techniques for distributing multiple programmable down-converted voltages using on-chip switching voltage regulators are described in more detail in U.S. patent application Ser. No. 10/606,619, "Integrated Circuit with High-Voltage, Low-Current Power Supply Distribution and Methods of Using the Same" by Bernard J. New et al., which is hereby incorporated by reference.

In the embodiment of FIG. 5, the granularity of the voltage scaled programmable logic blocks 301–304 should be fairly large because the overhead associated with switching regulators 501–504 is significant. In an FPGA, each programmable logic block 301–304 would most likely be divided into several clusters of configuration logic blocks (CLBs). The exact size of each programmable logic block may be determined by the desired trade-off among power savings, layout area overhead of the switching regulators, and the speed penalty.

Figure 6:
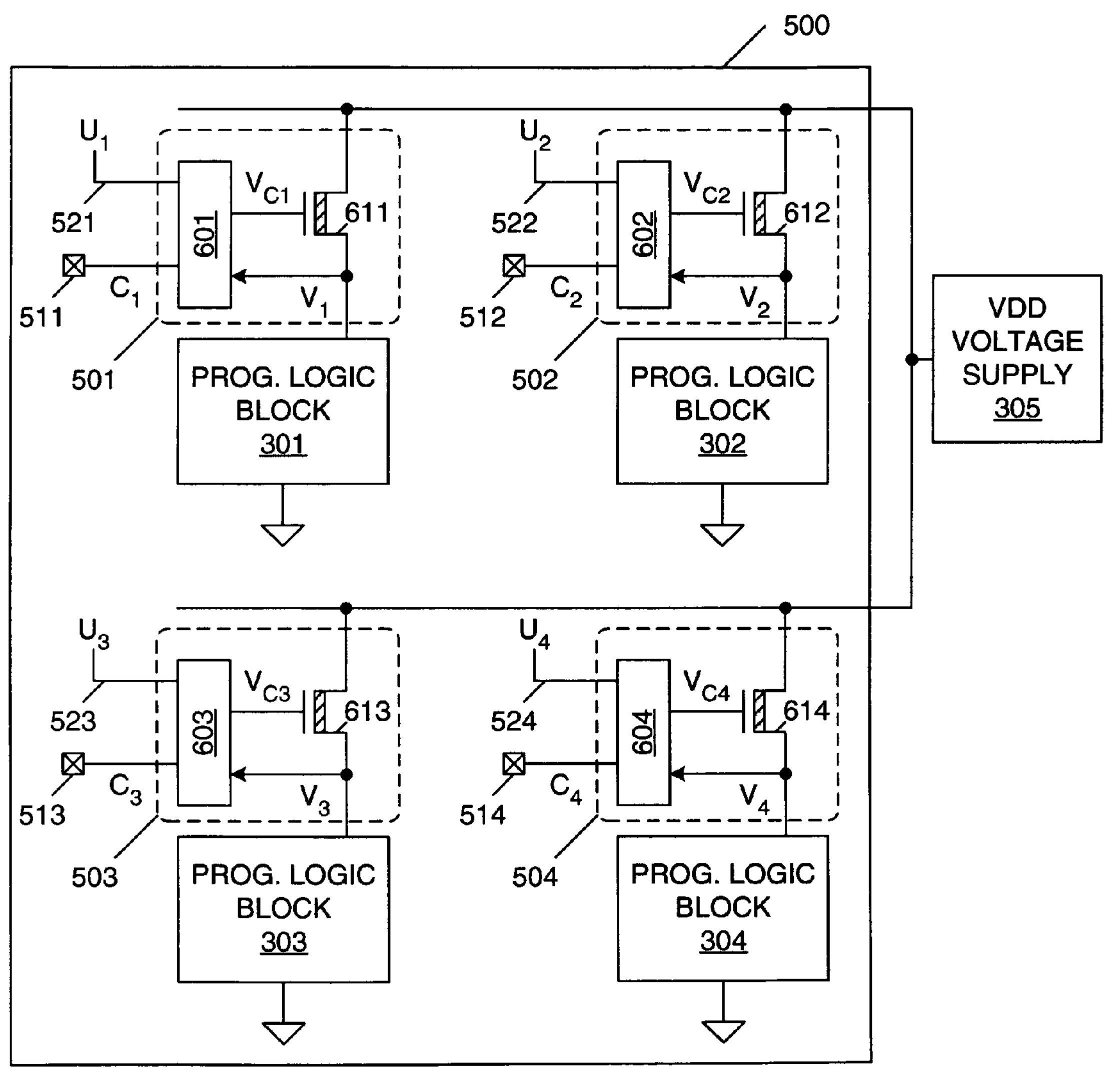
FIG. 6 is a block diagram of the PLD of FIG. 5, which shows switching regulators in accordance with one embodiment of the present invention.

FIG. 6 is a block diagram of PLD 500, which shows switching regulators 501–504 in accordance with one embodiment of the present invention. Switching regulators 501–504 include control blocks 601–604, respectively, and high-voltage n-channel transistors 611–614, respectively. High-voltage n-channel transistors 611–614 can tolerate high voltages and may have relatively thick gate dielectric layers (e.g., 50 to 60 Angstroms) and relatively wide channel regions. In some embodiments, the gate dielectric thickness of the high-voltage n-channel transistors 611–614 is approximately 4 to 6 times thicker than the gate dielectric thickness used in the programmable logic blocks 301–304. The drain of each of n-channel transistors 611–614 is coupled to the $V_{DD}$ voltage supply 305. The gates of n-channel transistors 611–614 are coupled to receive the control voltages $V_{C1}$–$V_{C4}$, respectively, from the corresponding control blocks 601–604. The source of each of n-channel transistors 611–614 is configured to provide an operating voltage $V_1$–$V_4$, respectively, to programmable logic blocks 301–304, respectively. The source of each n-channel transistor 611–614 is also coupled to the corresponding control block 601–604 in a feedback configuration.

Each of n-channel transistors 611–614 forms a power switch between the $V_{DD}$ supply voltage 305 and the associated programmable logic block. Thick oxide n-channel transistors 611–614 are used to implement the power switches to ensure that a high voltage, herein referred to as $V_{BOOST}$, can be applied to the gates of n-channel transistors 611–614 when the associated programmable logic block is active. The high voltage $V_{BOOST}$ increases the drive current of n-channel transistors 611–614. In accordance with one embodiment, the high voltage $V_{BOOST}$ is about 2 to 2.5 times greater than $V_{DD}$. When the high voltage $V_{BOOST}$ is applied to the gate of one of transistors 611–614, the corresponding operating voltage $V_1$–$V_4$ is pulled up to the full $V_{DD}$ supply voltage.

When a programmable logic block (e.g., programmable logic block 301) is inactive, the associated operating voltage (e.g., $V_1$) is reduced. The operating voltage applied to the associated programmable logic block is preferably selected to be high enough to retain data stored in this programmable logic block. In one embodiment, the operating voltage is reduced to a voltage that is about one half the $V_{DD}$ supply voltage. The operating voltage is reduced by applying a low voltage $V_{STANDBY}$ to the gate of the corresponding n-channel transistor (e.g., transistor 611). In one embodiment, the low voltage $V_{STANDBY}$ is about 80 to 100 percent of the $V_{DD}$ supply voltage.

In accordance with one embodiment, each of control blocks 601–604 is independently controlled to provide either the high voltage $V_{BOOST}$ or the low voltage $V_{STANDBY}$ to the associated n-channel transistor 611–614.

For example, control block 601 is configured to receive the user control signal $U_1$ and the configuration data value $C_1$, which have been described above. If both the user control signal $U_1$ and the configuration data value $C_1$ are deactivated, then control block 601 provides a control voltage $V_{C1}$ equal to the high voltage $V_{BOOST}$ to the gate of n-channel transistor 611. As a result, an operating voltage $V_1$ equal to the $V_{DD}$ supply voltage is applied to programmable logic block 301.

However, if either user control signal $U_1$ or configuration data value $C_1$ is activated, then control block 601 provides a control voltage $V_{C1}$ equal to the low voltage $V_{STANDBY}$ to the gate of n-channel transistor 611. As a result, an operating voltage $V_1$ approximately equal to one half the $V_{DD}$ supply voltage is applied to programmable logic block 301.

To ensure that the operating voltage $V_1$ applied to programmable logic block 301 has a value of ½ $V_{DD}$ when the $V_{STANDBY}$ voltage is applied to the gate of transistor 611, the control block 601 may include a feedback mechanism that adjusts the low voltage $V_{STANDBY}$ signal until the operating voltage $V_1$ is precisely equal to ½ $V_{DD}$, or any other desired voltage.

It is well known that the gate current through a transistor typically increases by an order of magnitude for every 0.3 Volt increase in the $V_{DD}$ supply voltage. It is therefore expected that reducing the operating voltage of a programmable logic block by half (½ $V_{DD}$) will reduce the gate current through the transistors present in the programmable logic block by an order of magnitude or more. At the same time, the sub-threshold leakage of these transistors will also decrease with the reduced operating voltage. Based on earlier generation technology, the leakage current may be reduced by 70% or more when reducing the operating voltage to ½ $V_{DD}$. Simulation of a ring oscillator shows that the ring oscillator will operate properly at the lower operating voltage (½ $V_{DD}$). It can be expected the associated logic block will retain stored data using the lower operating voltage. Therefore, the proposed switching regulators are capable of achieving more than 70% reduction in leakage current without a significant increase in area penalty and without sacrificing desired functionality.

In accordance with yet another embodiment of the present invention, the operating voltages applied to different blocks of a PLD are tuned based on application-specific timing characteristics to achieve a more power-efficient design implementation. Both the hardware architecture necessary to enable the tuning and the software flow used to perform the tuning are described below. The tuning may be performed at design time to optimize resources that have timing slacks, or at runtime to exploit periods of low workload.

It can be determined at design time, after the place and route steps, which parts of the PLD design have timing slacks. Programmable logic blocks with timing slacks are faster than what is necessary to meet the timing requirements of the PLD design. These blocks may be tuned to be slower, such that their timing slacks are reduced or eliminated, without negatively impacting the timing requirements of the overall design. The methods by which the programmable logic blocks are tuned also lower the power consumption of these blocks, thereby achieving a significant power reduction with no timing penalty. In essence, tuning the chip in this manner customizes the programmable logic device to meet the timing requirements of the PLD design, thereby resulting in a more power-efficient design mapping.

Figure 7:
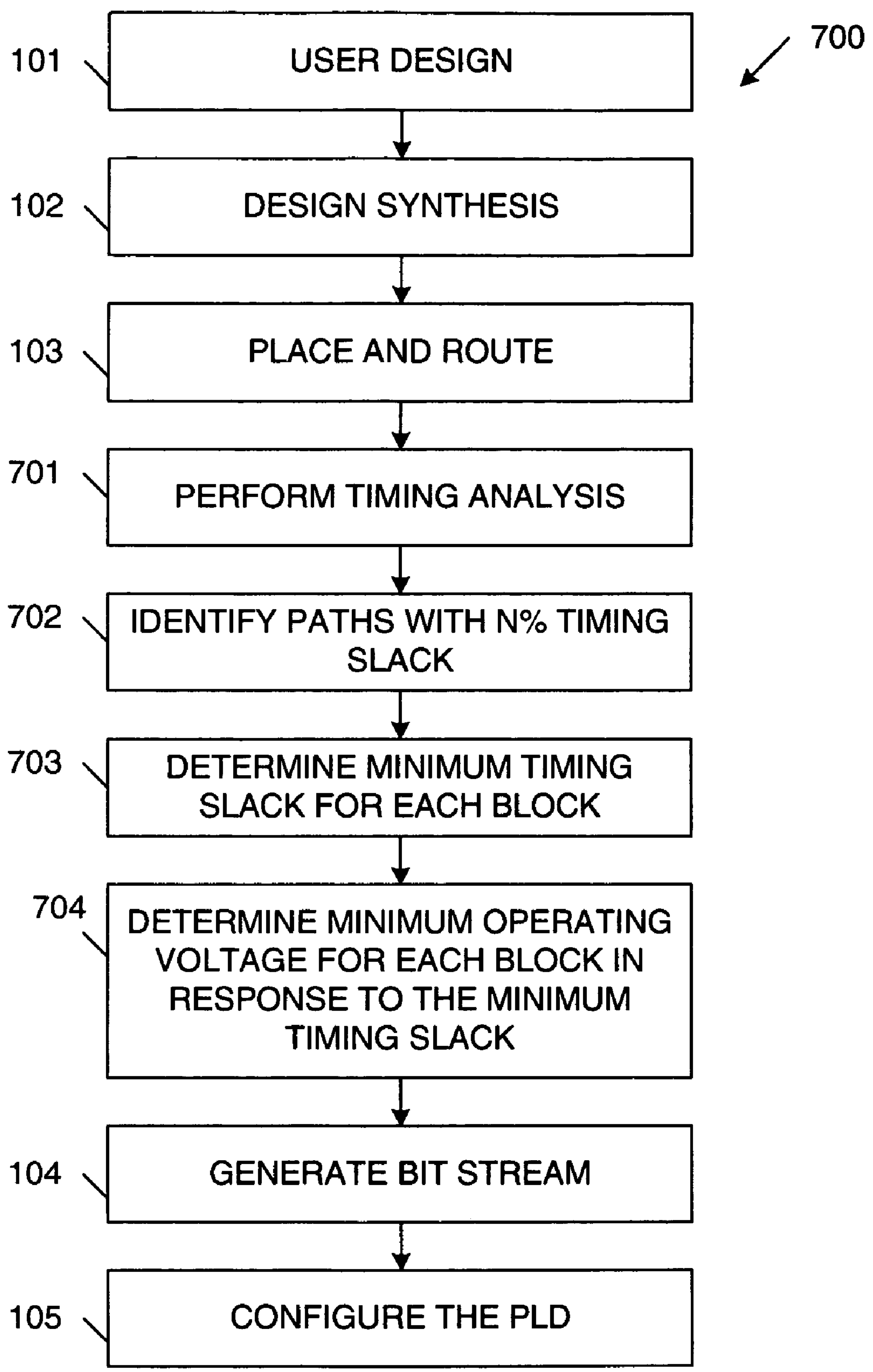
FIG. 7 is a flow diagram illustrating a design flow in accordance with the operating voltage tuning embodiment of the present invention.

FIG. 7 is a flow diagram 700 illustrating a design flow in accordance with the operating voltage tuning embodiment of the present invention. Similar steps in flow diagrams 100 and 700 are labeled with similar reference numbers. Thus, flow diagram 700 includes Steps 101–105 of flow diagram 100, which are described above. In addition, flow diagram 700 includes the step of performing a timing analysis on the PLD design (Step 701). This timing analysis identifies the delays along various paths of the PLD design. This timing analysis may be performed after the place and route process has been completed in Step 103.

After the timing analysis is complete, all paths having significant timing slacks are identified along with the amount of slacks they possess. In one embodiment, the timing slacks may be identified by comparing the expected delay of the path with the critical delay of the path. That is, the paths having timing slacks of N% or more of the critical delay are identified (Step 702). For example, in a synchronous design where the critical delay is 10 ns, all paths more than 20% faster than the critical delay are identified. As a result, all paths with delay of 8 ns or less are identified. These paths can all be slowed by at least 2 ns without impacting the timing of the overall design.

The minimum operating voltage for each block is then determined (Step 703). In accordance with one embodiment, a translation table is used (Step 704), wherein the translation table provides a minimum operating voltage in response to a particular timing slack. Note that for larger timing slacks, the minimum operating voltage will be lower.

Following the identification of paths with significant timing slacks, each independently tunable programmable logic block in the device is examined to determine the maximum amount of acceptable delay increase, which corresponds to the minimum timing slack among all of the paths in the programmable logic block (Step 703). Then, the minimum timing slack for each programmable logic block is converted to a minimum operating voltage by performing a lookup operation in a timing/voltage translation table (Step 704). The timing/voltage translation table can be populated via chip testing. The entries in the translation table may take the format of "X ns decrease in speed requires a supply voltage adjustment by Y Volts".

After the minimum operating voltage for each programmable logic block has been determined, the configuration bit stream is generated in Step 104. The configuration bit stream is generated such that the configuration bit stream applies the minimum operating voltages as determined in Step 704. As described in more detail below, the minimum operating voltages can be applied by setting the supply voltages to various programmable logic blocks of the PLD in response to the configuration data bits. The PLD is then configured in response to the configuration bit stream (Step 105).

In an enhanced version of the above-described embodiment, an initial timing analysis is performed prior to the place and route operation (Step 103), based on estimated delays of the various paths. The place and route step is then guided to group paths with significant timing slacks in to the same independently tunable block.

Figure 8:
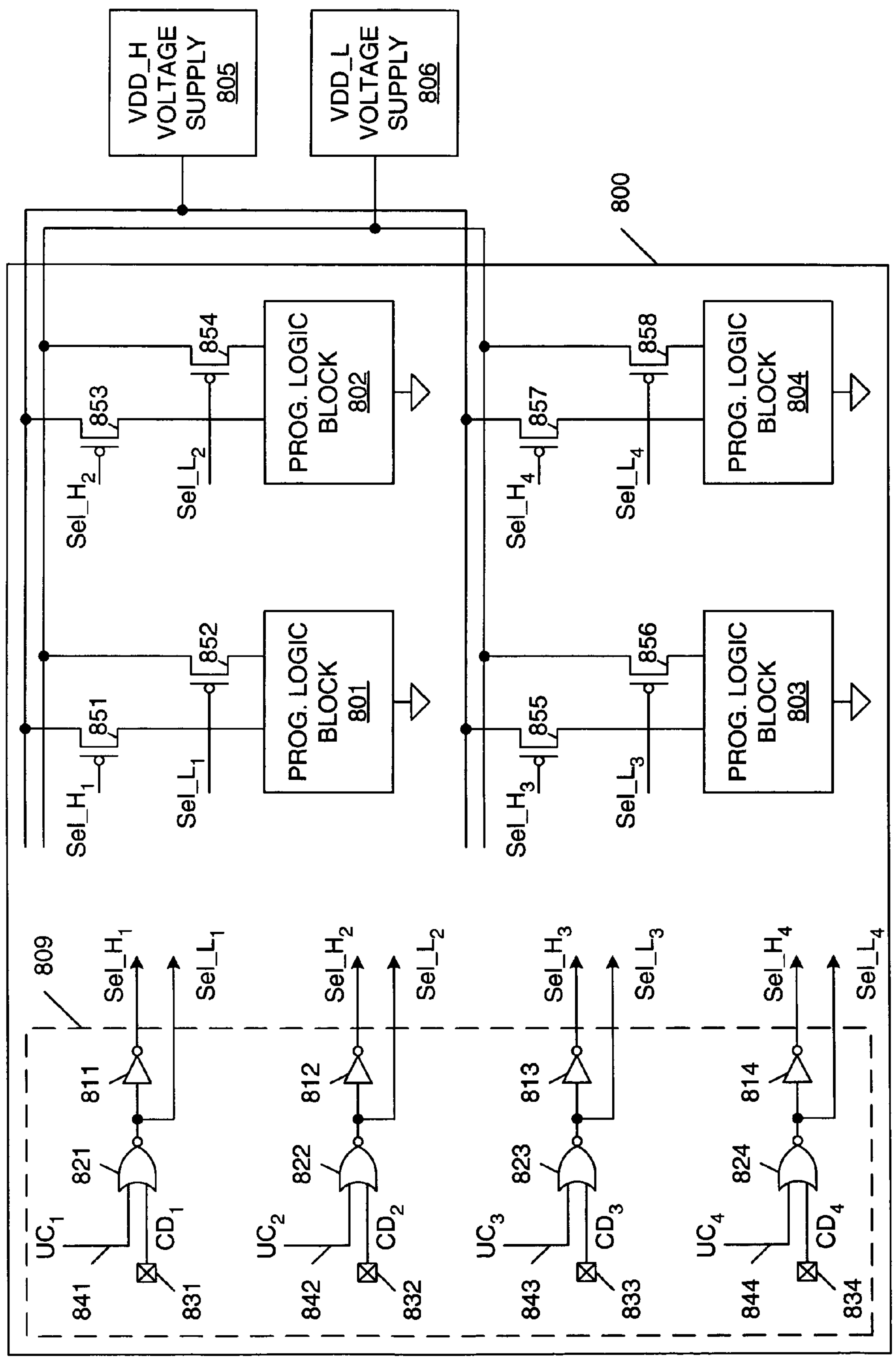
FIG. 8 is a block diagram of a PLD in accordance with a voltage tuning embodiment of the invention.

FIG. 8 is a block diagram of a PLD 800 in accordance with the present embodiment of the invention. PLD 800 includes programmable logic blocks 801–804, high voltage ($V_{DD}$_H) supply 805, low voltage ($V_{DD}$_L) supply 806, control circuit 809 and switch elements 851–858. In the described embodiment, switch elements 851–858 are implemented by PMOS power-gating transistors. Control circuit 809 is implemented by inverters 811–814, NOR gates 821–824, configuration memory cells 831–834, and user logic input terminals 841–844. The high voltage supply 805 is configured to provide a full $V_{DD}$ supply voltage, which is designated $V_{DD}$_H. The low voltage supply 806 is configured to provide a reduced $V_{DD}$ supply voltage, which is designated $V_{DD}$_L. The $V_{DD}$_L supply voltage is less than the $V_{DD}$_H supply voltage by a selected percentage. For example, the $V_{DD}$_L supply voltage may be 80 percent of the $V_{DD}$_H supply voltage.

NOR gates 821–824 and inverters 811–814 are configured to generate the high voltage select signals Sel_$H_1$–Sel_$H_4$ and the low voltage select signals Sel_$L_1$–Sel_$L_4$, in response to the configuration data values $CD_1$–$CD_4$ stored in configuration memory cells 831–834, respectively, and the user control signals $UC_1$–$UC_4$ provided on user logic input terminals 841–844, respectively.

For example, NOR gate 821 is coupled to receive configuration data value $CD_1$ from configuration memory cell 831 and user control signal $UC_1$ from user logic input terminal 841. If either the configuration data value $CD_1$ or the user control signal $UC_1$ is activated to a logic high state (indicating that a substantial timing slack exists in programmable logic block 801, and that the $V_{DD}$_L voltage supply 806 should be coupled to this block 801), then NOR gate 821 provides a low voltage select signal Sel_$L_1$ having a logic "0" state. In response, inverter 811, which is coupled to the output terminal of NOR gate 821, provides a high voltage select signal Sel_$H_1$ having a logic "1" state.

The logic "0" Sel_$L_1$ signal is applied to the gate of PMOS voltage select transistor 852, thereby turning on this transistor and coupling programmable logic block 801 to the $V_{DD}$_L voltage supply 806. The logic "1" Sel_$H_1$ signal is applied to the gate of PMOS voltage select transistor 851, thereby turning off this transistor and isolating programmable logic block 801 from the $V_{DD}$_H voltage supply 805. As a result, programmable logic block 801 operates in response to the $V_{DD}$_L supply voltage, $V_{DD}$_L, thereby minimizing the leakage current in this block.

If both the configuration data value $CD_1$ and the user control signal $UC_1$ are de-activated to a logic low state, (indicating that no substantial timing slack exists in programmable logic block 801, and that the $V_{DD}$_H voltage supply 805 should be coupled to this block 801), then NOR gate 821 provides a low voltage select signal $Sel\_L_1$ having a logic "1" state. In response, inverter 811 provides a high voltage select signal $Sel\_H_1$ having a logic "0" state.

The logic "0" $Sel\_H_1$ signal is applied to the gate of PMOS voltage select transistor 851, thereby turning on this transistor and coupling programmable logic block 801 to the $V_{DD}$_H voltage supply 805. The logic "1" $Sel\_L_1$ signal is applied to the gate of PMOS voltage select transistor 852, thereby turning off this transistor and isolating programmable logic block 801 from the $V_{DD}$_L voltage supply 806. As a result, programmable logic block 801 operates in response to the $V_{DD}$_H supply voltage, thereby enabling this block to operate at the required speed.

Programmable logic block 802 is coupled to the $V_{DD}$_H voltage supply 805 or the $V_{DD}$_L voltage supply 806 in response to configuration data value $CD_2$ and user control signal $UC_2$, in the same manner as block 801. Similarly, programmable logic block 803 is coupled to the $V_{DD}$_H voltage supply 805 or the $V_{DD}$_L voltage supply 806 in response to configuration data value $CD_3$ and user control signal $UC_3$, in the same manner as block 801. Programmable logic block 804 is coupled to the $V_{DD}$_H voltage supply 805 or the $V_{DD}$_L voltage supply 806 in response to configuration data value $CD_4$ and user control signal $UC_4$, in the same manner as block 801.

The $Sel\_H_1$–$Sel\_H_4$ and $Sel\_L_1$–$Sel\_L_4$ signals can be controlled by the configuration data values $CD_1$–$CD_4$ stored by configuration memory cells 831–834, which are best suited for coupling the associated blocks to the $V_{DD}$_L voltage supply 806 at design time. If a block is not coupled to the $V_{DD}$_L voltage supply 806 at design time, this block can be coupled to the $V_{DD}$_L voltage supply 806 at run time by the user control signals $UC_1$–$UC_4$, which may be generated by the user logic.

In accordance with another embodiment, a tunable programmable logic device is implemented by enabling local supply voltage scaling. In this scheme, each independently tunable programmable logic block is powered by a separate variable-voltage switching regulator. The programmable logic blocks are tuned by configuring the regulators to adjust the operating voltages applied to the programmable logic blocks. When the operating voltage of a programmable logic block is scaled down, the block becomes slower, and the dynamic and static power consumed by the block are dramatically reduced.

Figure 9:
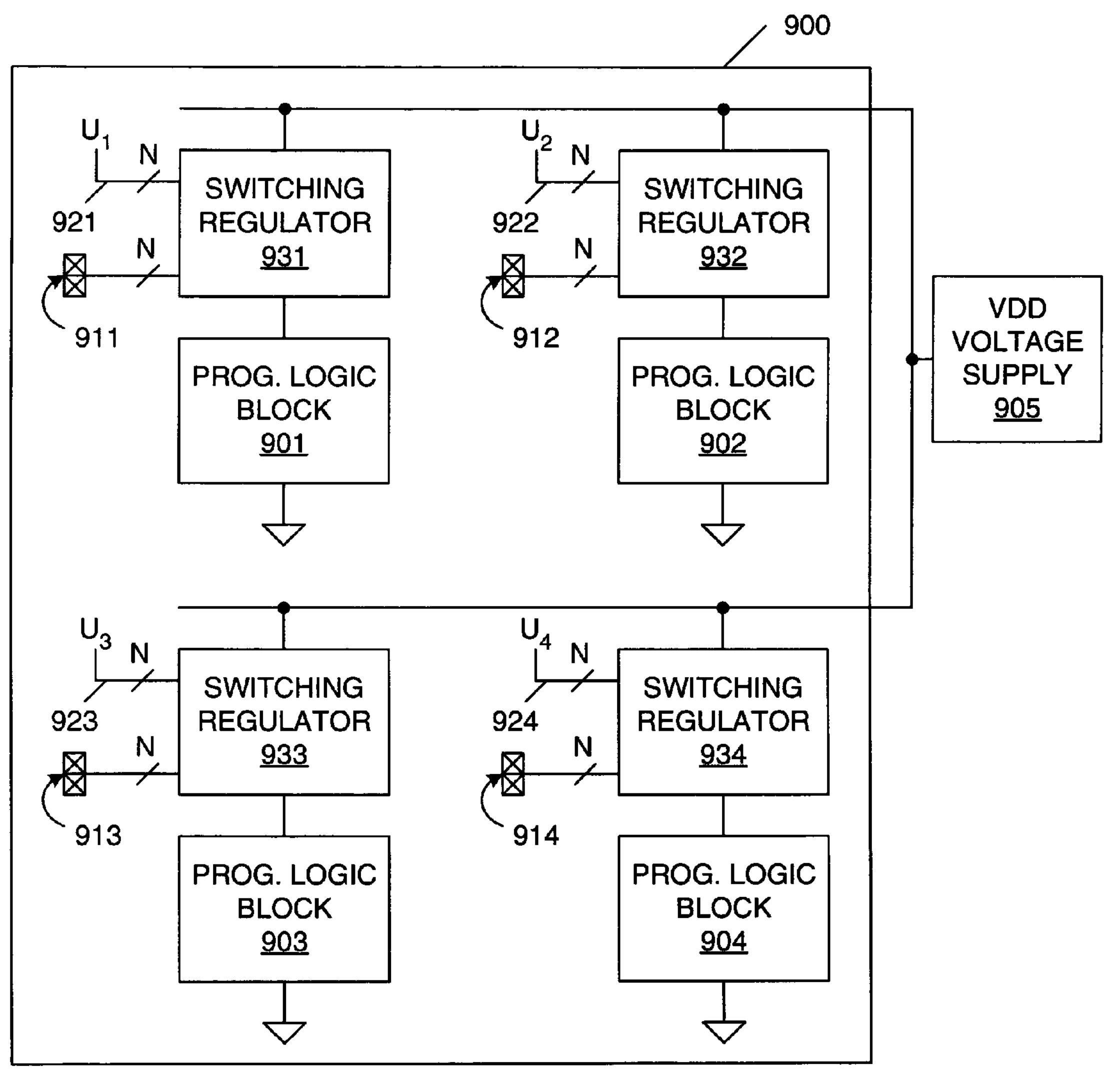
FIG. 9 is a block diagram of a PLD that implements variable voltage switching regulators in accordance with one embodiment of the invention.

FIG. 9 is a block diagram of a PLD 900 that implements variable voltage switching regulators in accordance with the present embodiment of the invention. PLD 900 includes programmable logic blocks 901–904, $V_{DD}$ voltage supply 905, configuration memory cell sets 911–914, user control terminal sets 921–924, and variable voltage switching regulators 931–934. Voltage regulators 931–934 are configured to provide operating voltages to programmable logic blocks 901–904, respectively, in response to the $V_{DD}$ supply voltage. Each of voltage regulators 931–934 independently may select one of two or more possible operating voltages in response to the configuration data bits stored in configuration memory cell sets 911–914, respectively. For example, if configuration memory cell set 911 includes two configuration memory cells (N=2), then voltage regulator 931 may provide operating voltages equal to $V_{DD}$, $0.95V_{DD}$, $0.9V_{DD}$ or $0.85\ V_{DD}$ in response to the configuration data bits stored in configuration memory cell set 911. Other numbers of configuration memory cells and other operating voltages can be provided in other embodiments.

It is further possible to tune PLD 900 dynamically (during runtime) to exploit variations in the application's workload or performance requirements. Many user designs go through periods of low workload, during which the affected blocks may be tuned to lower speed and lower power. The tuning is preferably initiated by the user design, since the user has the best knowledge of when extended periods of low workload will occur. One way to enable dynamic scaling of local voltages is through dynamic reconfiguration of the programmable regulators using techniques described by Brandon J. Blodget et al., "Reconfiguration of a Programmable Logic Device Using Internal Control," U.S. patent application Ser. No. 10/377,857.

In accordance with one embodiment, the user may implement such an adjustment by varying the N signals provided on the user control terminal set 921, or by rewriting the desired configuration memory bits into configuration memory cell set 911. The other variable voltage switching regulators 932–934 are controlled in the same manner as voltage regulator 931.

In the described embodiment, variable voltage switching regulators 931–934 reside on the same chip as programmable logic blocks 901–904. However, in other embodiments, these voltage regulators 931–934 can be located external to the chip containing blocks 901–904.

Moreover, although the examples illustrate a PLD divided into four blocks, it should be understood that the PLD can be divided into arbitrary number of blocks, and each block can be of arbitrary granularity. In the embodiment of FIG. 9, the granularity of the voltage scaled programmable logic blocks 901–904 should be fairly large because the overhead associated with variable voltage switching regulators 931–934 is significant. In an FPGA, each programmable logic block 901–904 would most likely be divided into several clusters of configuration logic blocks (CLBs). The exact size of each programmable logic block is determined by the desired trade-off between power savings and the layout area overhead of the switching regulators. Techniques for distributing multiple programmable voltages by using on-chip switching voltage regulators are described by Bernard J. New et al., in "Integrated Circuit With High-Voltage, Low-Current Power Supply Distribution And Methods Of Using The Same," U.S. patent application Ser. No. 10/606,619.

Communication across programmable logic blocks having different operating voltages does not require special attention if the voltage difference is relatively small. However, when signals propagate from a low voltage block to a high voltage block, even small voltage differences can lead to significant DC current leakage in the high-voltage block due to transistors that are not completely turned off. To eliminate such DC current leakage, and to facilitate communication across two blocks of arbitrarily different voltages, level-shifters should be used as interfacing logic. To reduce area and speed overhead, level-shifters can be integrated into flip-flops, which are typically present on the programmable logic device.

Figure 10:
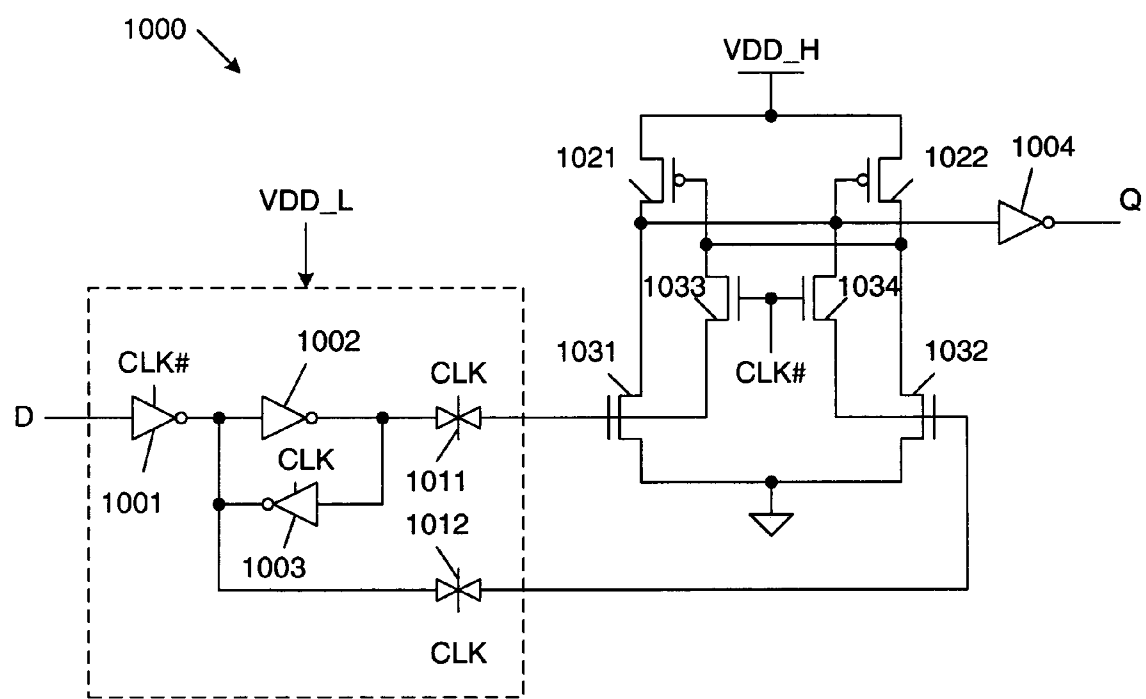
FIG. 10 is a circuit diagram of a level-shifting flip-flop for use in various embodiments of the present invention.

FIG. 10 is a circuit diagram of a level-shifting flip-flop 1000, for use in accordance with one embodiment of the present invention. Flip-flop 1000 includes inverters 1001–1004, complementary pass gates 1011–1012, p-channel transistors 1021–1022, and n-channel transistors 1031–1034. Inverters 1001–1003 and complementary pass gates 1011–1012 operate in response to the $V_{DD}$_L supply voltage. When the CLK# signal is high (CLK is low), inverter 1001 is enabled to route the inverse of the input data value D to inverter 1002. Note that the input data value D is defined at the $V_{DD}$_L voltage level. Inverter 1003 and complementary pass gates 1011–1012 are disabled by the low CLK signal at this time.

When the CLK signal transitions to a logic high state (CLK# is low), inverter 1001 is disabled and inverter 1003 is enabled, thereby allowing the data value D to be latched into cross-coupled inverters 1002–1003. The logic low CLK# signal disables n-channel transistors 1033 and 1034. The high CLK signal also enables complementary pass gates 1011–1012, thereby applying the data value D and the inverse data value D# to the gates of n-channel transistors 1031 and 1032, respectively. As a result, the data value D or the inverse data value D# turns on one of n-channel transistors 1031 or 1032. For example, if the data value D has a logic low state, then n-channel transistor 1031 is turned off and n-channel transistor 1032 is turned on. Turned on transistor 1032 pulls down the gate voltage of p-channel transistor 1021 to ground, thereby turning on this transistor 1021. Turned on transistor 1021 applies the $V_{DD}$_H voltage to the gate of p-channel transistor 1022 (thereby turning this transistor off), and to the input terminal of inverter 1004 (which provides a logic low Q output signal). Note that the Q output signal has been translated to the $V_{DD}$_H voltage level. When the CLK signal transitions to a logic low state (CLK# is high), the n-channel transistors 1033–1034 turn on, thereby latching the data value D until the next rising edge of the CLK signal. Level-shifting flip flop 1000 is described in more detail by M. Takahashi et al., "A 60 mW MPEG4 Video Codec using Clustered Voltage Scaling with Variable Supply-Voltage Scheme," Journal of Solid State Circuits, vol. 33, no. 11, pp. 1772–1780, November 1998.

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

We claim:

1. A method of operating a programmable logic device comprising:

performing a timing analysis of a design of the programmable logic device having a plurality of active blocks, each active block of the plurality of active blocks having a plurality of paths;

determining a plurality of timing slacks associated with a plurality of paths of an active block for each of the plurality of active blocks of the design;

determining a minimum timing slack for each of the plurality of active blocks of the design;

enabling, for each active block of the plurality of active blocks, the assignment of either of a first supply voltage or a second supply voltage to operate an active block;

assigning the first supply voltage to operate a first set of one or more active blocks of the programmable logic device, the first supply voltage corresponding to the minimum timing slack determined for each active block in the first set; and assigning the second supply voltage, less than the first supply voltage, to operate a second set of one or more active blocks of the programmable logic device, the second supply voltage corresponding to the minimum timing slack determined for each active block in the second set, wherein minimum timing slacks determined for each active block in the first set are less than minimum timing slacks determined for each active block in the second set.

2. The method of claim 1, wherein the steps of assigning the first supply voltage and assigning the second supply voltage are performed in response to configuration data values stored during configuration of the programmable logic device.

3. The method of claim 1, wherein the steps of assigning the first supply voltage and assigning the second supply voltage are performed in response to user controlled signals provided during run time of the programmable logic device.

4. The method of claim 3, further comprising generating the user controlled signals in response to operating conditions of the programmable logic device during run time.

5. The method of claim 1, wherein the steps of assigning the first supply voltage and assigning the second supply voltage are performed in response to configuration data values stored during run time of the programmable logic device.

6. The method of claim 1, further comprising assigning a third supply voltage, less than the second supply voltage, to operate a third set of one or more active blocks of the programmable logic device, wherein timing slacks of the third set of one or more active blocks are greater than timing slacks of the first and second sets of one or more active blocks.

7. The method of claim 1, further comprising:

identifying the first set of one or more active blocks as active blocks in the design having timing slacks less than a threshold timing slack; and identifying the second set of one or more active blocks as active blocks in the design having timing slacks greater than the threshold timing slack.

8. The method of claim 1, further comprising generating a configuration bit stream in response to the steps of assigning the first supply voltage and assigning the second supply voltage.

9. The method of claim 8, further comprising, configuring the programmable logic device in response to the configuration bit stream.

10. The method of claim 1, further comprising selecting the first set of one or more active blocks and the second set of one or more active blocks in response to the step of determining timing slacks.

11. The method of claim 1, further comprising selecting the second voltage supply to be a minimum voltage required to maintain functionality of the second set of one or more active blocks.

12. A programmable logic device comprising:

a voltage supply terminal configured to receive a supply voltage;

a plurality of programmable logic blocks, each having an associated minimum timing slack determined from a corresponding plurality of timing slacks associated with a plurality of paths of a programmable logic block and receiving a selected one of a plurality of operating voltages;

a plurality of variable voltage regulators, each coupled between the voltage supply terminal and a corresponding one of the programmable logic blocks and selecting one of the plurality of operating voltages for the corresponding one of the programmable logic blocks; and means for controlling the variable voltage regulators such that each of the variable voltage regulators provides an operating voltage to the corresponding one of the programmable logic blocks, wherein the operating voltage is selected in response to the minimum timing slack associated with the corresponding one of the programmable logic blocks.

13. The programmable logic device of claim 12, wherein the means for controlling comprises one or more configuration memory cells coupled to each of the variable voltage regulators.

14. The programmable logic device of claim 12, wherein the means for controlling comprises one or more user input terminals coupled to each variable voltage regulator.

15. The programmable logic device of claim 12, further comprising a plurality of level shifters coupled among the plurality of programmable logic blocks.

16. A programmable logic device comprising:

a first voltage supply terminal configured to receive a first supply voltage;

a second voltage supply terminal configured to receive a second supply voltage, less than the first supply voltage;

a plurality of programmable logic blocks, each having an associated minimum timing slack determined from a corresponding plurality of timing slacks associated with a plurality of paths of the programmable logic block;

a plurality of first voltage switches, each coupled between the first voltage supply terminal and a corresponding one of the programmable logic blocks;

a plurality of second voltage switches, each coupled between the second voltage supply terminal and a corresponding one of the programmable logic blocks; and means for controlling the first and second voltage switches such that each of the programmable logic blocks is coupled to receive one of the first voltage supply and the second voltage supply, wherein each of the programmable logic blocks having an associated minimum timing slack less than a threshold timing slack is coupled to receive the first supply voltage, and each of the programmable logic blocks having an associated minimum timing slack greater than the threshold timing slack is coupled to receive the second supply voltage.

17. The programmable logic device of claim 16, wherein the means for controlling comprises one or more configuration memory cells coupled to the first and second voltage switches.

18. The programmable logic device of claim 16, wherein the means for controlling comprises one or more user input terminals coupled to the first and second voltage switches.

19. The programmable logic device of claim 16, further comprising a plurality of level shifters coupled among the plurality of programmable logic blocks.

* * * * *